(12) United States Patent
Van Bommel et al.

(10) Patent No.: US 12,018,802 B2
(45) Date of Patent: Jun. 25, 2024

(54) LIGHT EMITTING DEVICE WITH SPARKLING EFFECT

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/009,028

(22) PCT Filed: May 28, 2021

(86) PCT No.: PCT/EP2021/064319
§ 371 (c)(1),
(2) Date: Dec. 8, 2022

(87) PCT Pub. No.: WO2021/249788
PCT Pub. Date: Dec. 16, 2021

(65) Prior Publication Data
US 2023/0272888 A1 Aug. 31, 2023

(30) Foreign Application Priority Data
Jun. 8, 2020 (EP) .................................... 20178673

(51) Int. Cl.
*F21K 9/65* (2016.01)
*F21K 9/61* (2016.01)
(Continued)

(52) U.S. Cl.
CPC .................. *F21K 9/65* (2016.08); *F21K 9/61* (2016.08); *F21Y 2103/10* (2016.08); *F21Y 2115/10* (2016.08)

(58) Field of Classification Search
CPC ...................................... F21K 9/65; F21K 9/61
See application file for complete search history.

(56) References Cited

U.S. PATENT DOCUMENTS

2019/0252460 A1 8/2019 Andrews et al.
2019/0331303 A1 10/2019 Jiang et al.
(Continued)

FOREIGN PATENT DOCUMENTS

WO 2017153252 A1 9/2017
WO 2017162821 A2 9/2017
(Continued)

*Primary Examiner* — Christopher E Dunay

(57) ABSTRACT

A light emitting diode, LED, filament comprising a core portion having an elongated carrier, comprising a first major surface and a second major surface, a plurality of LEDs arranged on at least one of the first and second major surfaces of the elongated carrier, a light transmissive encapsulant, encapsulating the plurality of LEDs, and at least partially encapsulating the elongated carrier, and configured to transmit a first light with a first angular distribution, the filament further comprising a plurality of light transmissive light guiding structures arranged on discreet portions of an outer surface of the encapsulant, along a length, L, of the core portion, and arranged to in-couple a portion of the first light, and out-couple a second light, with a second angular distribution, such that the first and second angular distributions are not equal.

14 Claims, 11 Drawing Sheets

(51) Int. Cl.
 *F21Y 103/10* (2016.01)
 *F21Y 115/10* (2016.01)

(56) References Cited

U.S. PATENT DOCUMENTS

| | | | |
|---|---|---|---|
| 2020/0141541 A1* | 5/2020 | Van Bommel | F21K 9/232 |
| 2022/0018499 A1 | 1/2022 | Hikmet et al. | |
| 2022/0154891 A1 | 5/2022 | Van Bommel et al. | |
| 2022/0186889 A1 | 6/2022 | Hikmet et al. | |
| 2022/0349530 A1* | 11/2022 | Van Bommel | F21K 9/232 |
| 2022/0403987 A1* | 12/2022 | Van Bommel | F21V 29/70 |
| 2023/0099125 A1* | 3/2023 | Van Bommel | H01L 25/0753 |
| | | | 362/257 |
| 2023/0258320 A1* | 8/2023 | Van Bommel | H01L 33/505 |
| | | | 362/84 |

FOREIGN PATENT DOCUMENTS

| | | |
|---|---|---|
| WO | 2018202625 A1 | 11/2018 |
| WO | 2020088966 A1 | 5/2020 |
| WO | 2020229462 A1 | 11/2020 |

\* cited by examiner

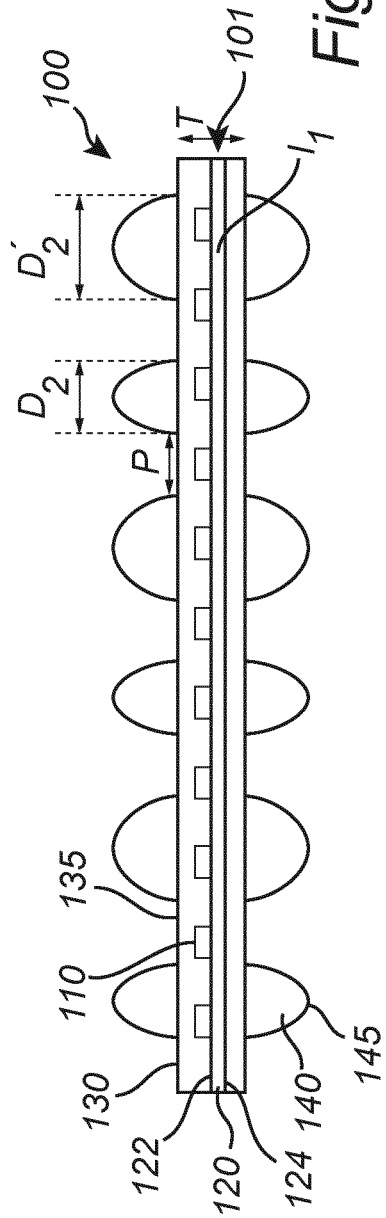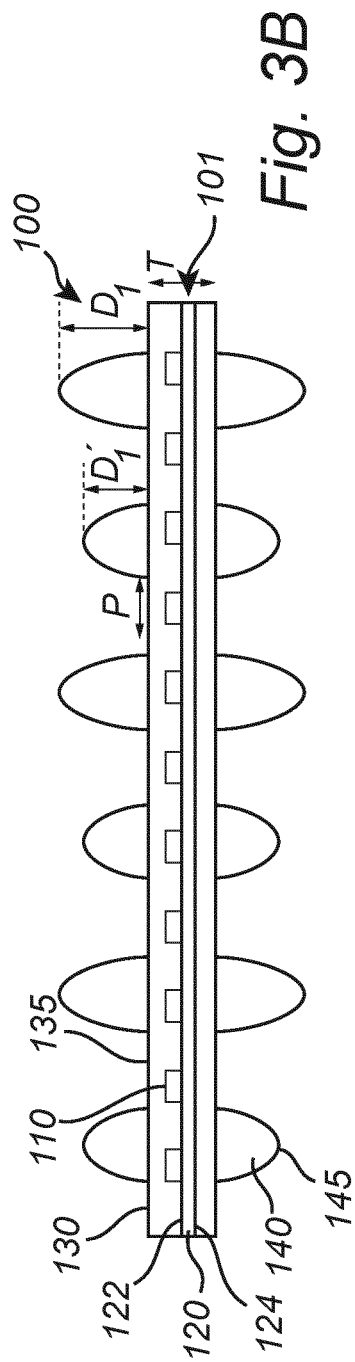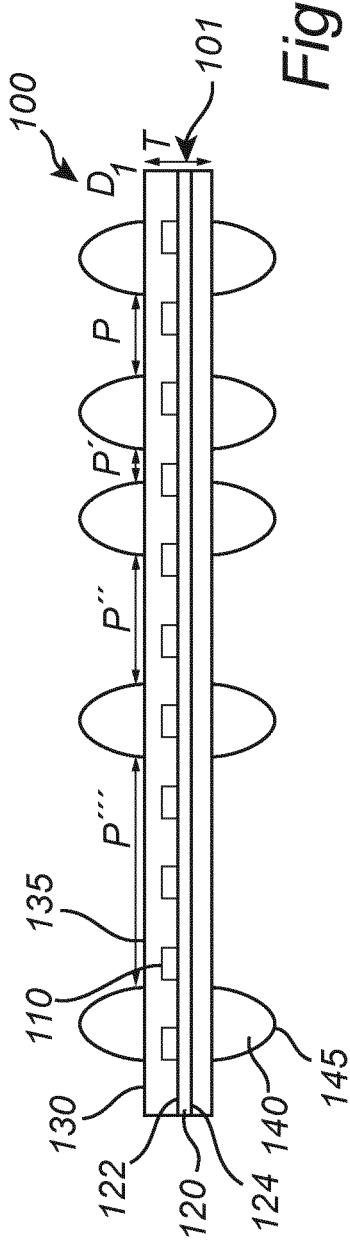

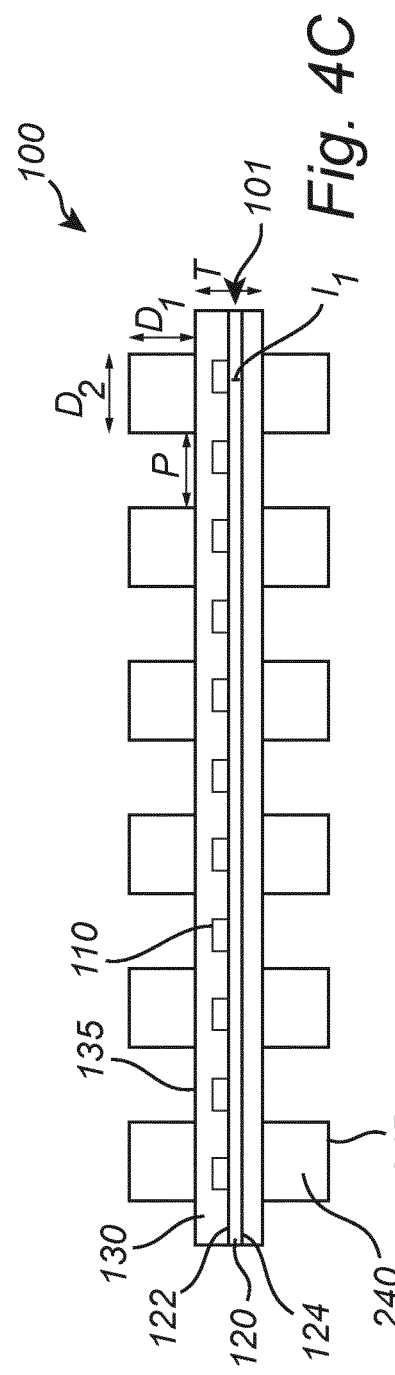

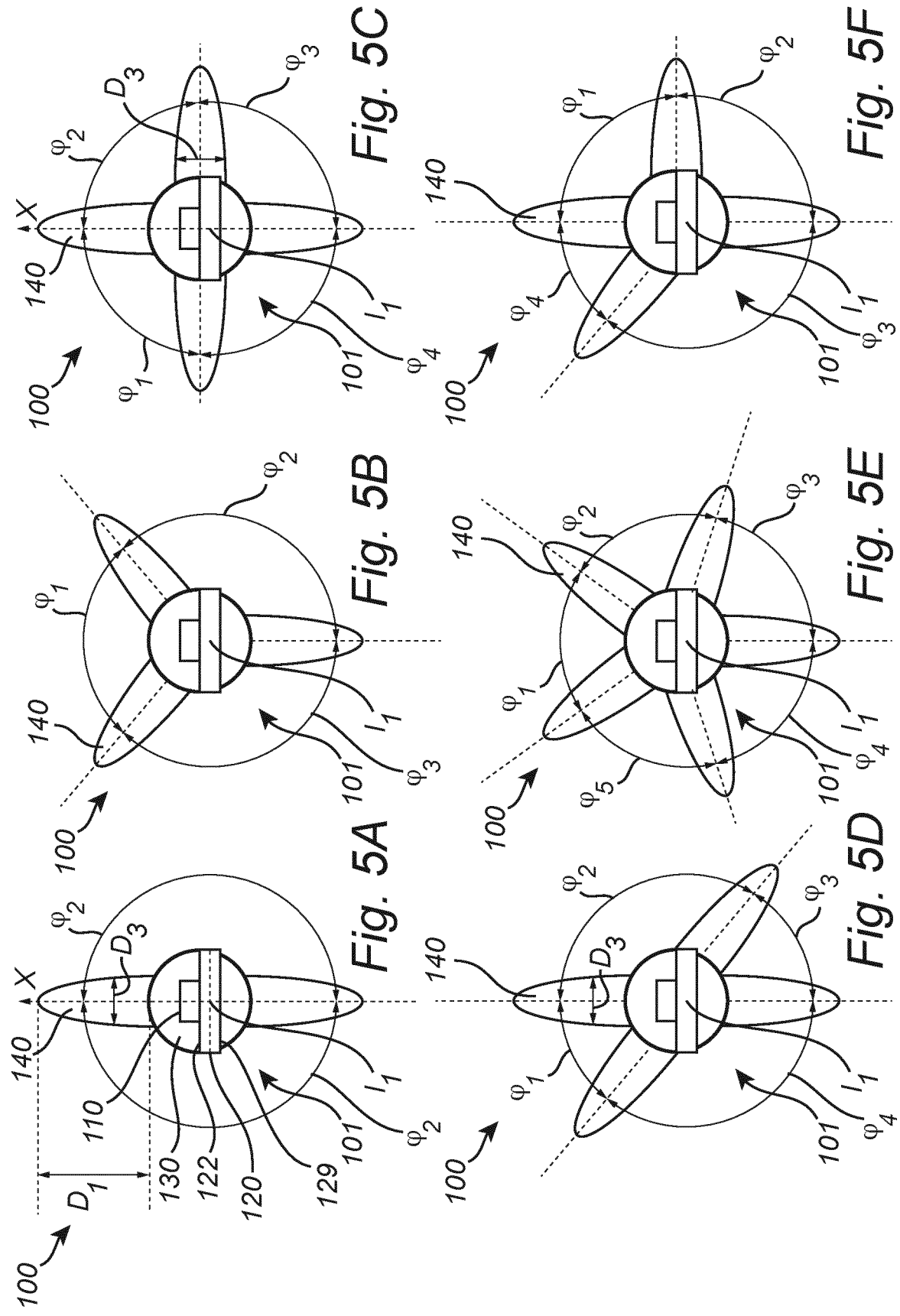

LIGHT EMITTING DEVICE WITH SPARKLING EFFECT

CROSS-REFERENCE TO PRIOR APPLICATIONS

This application is the U.S. National Phase application under 35 U.S.C. § 371 of International Application No. PCT/EP2021/064319, filed on May 28, 2021, which claims the benefit of European Patent Application No. 20178673.8, filed on Jun. 8, 2020. These applications are hereby incorporated by reference herein.

FIELD OF THE INVENTION

This invention relates to LED filament light emitting devices.

BACKGROUND OF THE INVENTION

Incandescent lamps are rapidly being replaced by LED based lighting solutions. It is nevertheless appreciated and desired by users to have retrofit lamps which have the look of an incandescent bulb. For this purpose, one can simply make use of the infrastructure for producing incandescent lamps based on glass and replace the filament with LEDs emitting white light. One of the concepts is based on LED filaments placed in such a bulb. The appearances of these lamps are highly appreciated as they look highly decorative. Therefore, it is desirable to introduce additional visual effects, such as a sparkling or glittering effect to such filament lamps in order to make them more decorative.

In an attempt to provide for the latter, WO2017153252 discloses a lighting device which comprises an exposed outer surface and at least one primary light source disposed within a chamber. The chamber has an internal surface arrangement including a first surface portion and an opposing second surface portion. The primary light source is located on the first surface portion. The second surface portion is translucent, and the primary light source illuminates the plurality of light exit areas delimited by the translucent second surface thus providing both functional lighting for illuminating a space while having a spatially dynamic sparkling light display. Even though the lighting device is simultaneously configured to provide a visually appealing lighting effect, in particular, a dynamic sparkling or glittering effect, the solution entails panels acting as secondary light emitting surfaces with anisotropic luminance.

SUMMARY OF THE INVENTION

It is an object of the present invention to overcome this problem, and to provide an LED filament with a sparkling effect directly from the filament.

The present invention relates to an LED filament in accordance with the independent claim 1. Preferred embodiments are defined by the dependent claims.

According to a first aspect of the invention, this and other objects are achieved through a light emitting diode, LED, filament comprising a core portion having an elongated carrier, comprising a first major surface and a second major surface, a plurality of LEDs arranged on at least one of the first and second major surfaces of the elongated carrier, an configured to emit light, a light transmissive encapsulant, encapsulating the plurality of LEDs, and at least partially encapsulating the elongated carrier, and configured to transmit a first light with a first angular distribution, the filament further comprising a plurality of light transmissive light guiding structures arranged on discreet portions of an outer surface of the encapsulant, along the length, L, of the core portion, and arranged to in-couple a portion of the first light, and out-couple a second light, with a second angular distribution, such that said second angular distribution in narrower than said first angular distribution. The LEDs may include a plurality of red (R), green (G), and blue (B) LEDs. Additionally, or alternatively, the LEDs may include a plurality of white LEDs.

The LEDs may be arranged exclusively on one of the first or second major surfaces. Alternatively, the LEDs may be arranged on both the first and second major surfaces.

By light guiding it is meant that the structures have a higher refractive index compared to their ambient. Therefore, while a portion of the in-coupled first light traverses the body of these structures without any substantial change of direction, a portion of the in-coupled first light in these light guiding structures will undergo total internal reflection depending on their incident angle at the boundary between the interior of the structures and the outer ambient and change direction. The refractive index of the light guiding structures may be different compared to the refractive index of the encapsulant. This may result in that light is majorly out-coupled from the top and/or sides of the structures in a second angular distribution that is narrower than the first angular distribution in which light exits the encapsulant.

The light guiding structures may be comprised of material such as but not limited to Silicone. The light guiding structures may be flexible. Alternatively, they may be rigid.

In an embodiment, the carrier is light transmissive. This will allow for light emitted by the LEDs to traverse the thickness of the carrier and exit the opposite major surface to which the LED is sitting on. As a result, light may be distributed from both sides of the LED filament. The carrier may be light translucent, or preferably light transparent, so to allow for light emitted by the LEDs to traverse the encapsulant thickness without any substantial reflection or refraction.

In an embodiment, the light guiding structures have an axial dimension, D1, a width, D2, and a depth, D3, and said axial dimension D1 extends outwards from said outer surface of said encapsulant, and is larger than the width D2, and the depth D3. In the context of the invention, by dimension it is meant to convey the measurable extent of an object, more specifically the light guiding structures in a Cartesian coordinate system, namely length, width, and depth.

According to an embodiment, the axial dimension of the light guiding structures is preferably at least two times larger, more preferably at least three times larger, most preferably at least four times larger than a thickness, T, of the core portion of the filament. In other words, the light guiding structures may have a high aspect ratio. By high aspect ratio it is meant that the length to width ratio of the structures is substantially high, for example more than 2, preferably more than 3, most preferably more than 4. This may offer the benefit of having an even more pronounced sparkling appearance by the light guiding structures, instead of just a thickened appearance of the core portion of the LED filament.

In an embodiment, the axial dimension extends in a direction normal to the outer surface of the encapsulant. Alternatively, the light guiding structures may be arranged to have an angle other than normal to the outer surface of the encapsulant, resulting in a tilted arrangement.

In an embodiment, the light guiding structures are arranged on said encapsulant such that a pitch, P, between each consecutive light guiding structure is at least equal to, preferably at least two times larger, more preferably at least three times larger, most preferably at least four times larger than the core portion thickness. This again, may offer the benefit of an efficient sparkling appearance by the light guiding structures instead of a thickened appearance of the core portion of the filament.

According to an embodiment, the light guiding structures have an equal form and/or size. This embodiment may lead to a regular sparkling appearance of the LED filament. In the context of the invention, by form it is meant the 3D form (morphology) of the light guiding elements. Additionally, unless stated otherwise, by shape it is meant to refer to a 2D projection of the structures on a plane, in other words, the cross section of a 3D structure in a certain direction. The form of the light guiding structures may be semi-ellipsoid, or cuboid, or any other geometrical 3D form. In more general terms, the cross section of the light guiding structures along a certain dimension may remain invariable (such as in a cuboid), or alternatively may change in size and/or shape (such as in ellipsoids). The light guiding structures may have a curved shape. If the direction of the axial dimension of the light guiding structures is taken parallel to the X-axis in a Cartesian coordinate system, the curvature may be in relation to any axis of the coordinate system. Alternatively, the light guiding structures may have a straight shape.

In an alternative embodiment the light guiding structures may have different forms, or alternatively the same form but different sizes. The latter embodiments may give an irregular sparkling appearance to the LED filament.

According to an embodiment, the pitch between the consecutive light guiding structures are equal. This may give a regular sparkling appearance of the LED filament. According to an alternative embodiment, the pitch between consecutive light guiding structures may be different. The alternative embodiment may lead to an irregular sparkling effect of the LED filament.

According to an embodiment, the light guiding structures have an ellipsoid form, arranged concentrically around the core portion of the filament, and such that the axial dimension of the light guiding structures is the largest axis of the ellipsoid.

According to an embodiment, two or more light guiding structures are arranged on a same longitudinal position along the length of the core portion of the filament, concentrically surrounding the core portion. According to this embodiment, the two or more light guiding structures arranged on the same longitudinal position of the core portion, may be arranged to be circumferentially symmetrical, meaning that they will have an equal radial distance in relation to one another. Alternatively, the may be circumferentially asymmetrical.

According to an embodiment, the light guiding structures are light transparent. This will substantially eliminate any scattering, and or refraction within the body of the light guiding structures.

According to an embodiment, the light guiding structures comprise luminescent material. For converting light emitted from colored LEDs to white light, the light guiding structures may comprise luminescent material. These materials may comprise luminescent particles, such as but not limited to phosphorous particles, embedded within the matrix of the light guiding structure.

According to an embodiment, the light guiding structures comprise light scattering material. The light scattering material may comprise light scattering particles from material such as but not limited to $TiO_2$, $BaSO_4$, and/or Silicone particles embedded within the matrix of the light guiding structures. These particles may scatter and mix light traversing the body of the light guiding structures by randomizing initial direction of light. Additionally, the scattering of light by the scattering particles may enhance the sparkling appearance of the LED filament.

According to an embodiment, the light guiding structures have a rough outer surface. The outer surface of the light guiding structures may be roughened by methods such as but not limited to etching. A roughened outer surface may have the additional effect of scattering the second light upon out-coupling from the light guiding structures. This may in turn affect the second angular distribution of the second light. It may be that the entire outer surface of the light guiding structures is roughened. Alternatively, it may be that only a portion of the outer surface of the light guiding structures is roughened. The roughening degree may affect the magnitude of light scattering; i.e. the higher the roughness, the higher the scattering properties may be.

According to an embodiment, light is arranged to out-couple only from an end portion of the light guiding structures.

This may be realized by covering all other portions of the light guiding structures with a highly light reflective or alternatively, a light absorbing material and/or structure, while leaving only the end portion light transmissive. This may aid in narrowing the second distribution angle of light even further.

The light guiding structures may be transparent at least for 0.5 of the axial dimension defined from the attachment to the core portion of the LED filament, preferably 0.7 of the axial dimension, more preferably 0.9 of the axial dimension, most preferably the entirety of the axial dimension.

In an exemplified embodiment according to the latter preference of transparency along the entire axial dimension, the light guiding structures may be light transparent such that a portion of the in-coupled light undergoes a total internal reflection within the light guiding structures preferably at least twice before being out-coupled from the end portion of the light guiding structure.

According to a second aspect, a retrofit light bulb, comprising at least one LED filament, a transmissive envelope, at least partially surrounding the LED filament(s), and a connector for electrically and mechanically connecting the light bulb to a socket.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

FIGS. 3A-3C demonstrate different embodiments of an LED filament with semi ellipsoid light guiding structures.

FIGS. 4A-4C demonstrate different embodiments of an LED filament with light guiding structures.

FIGS. 5A-5F demonstrate radial cross-sectional views of different embodiments of an LED filament with light guiding structures.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
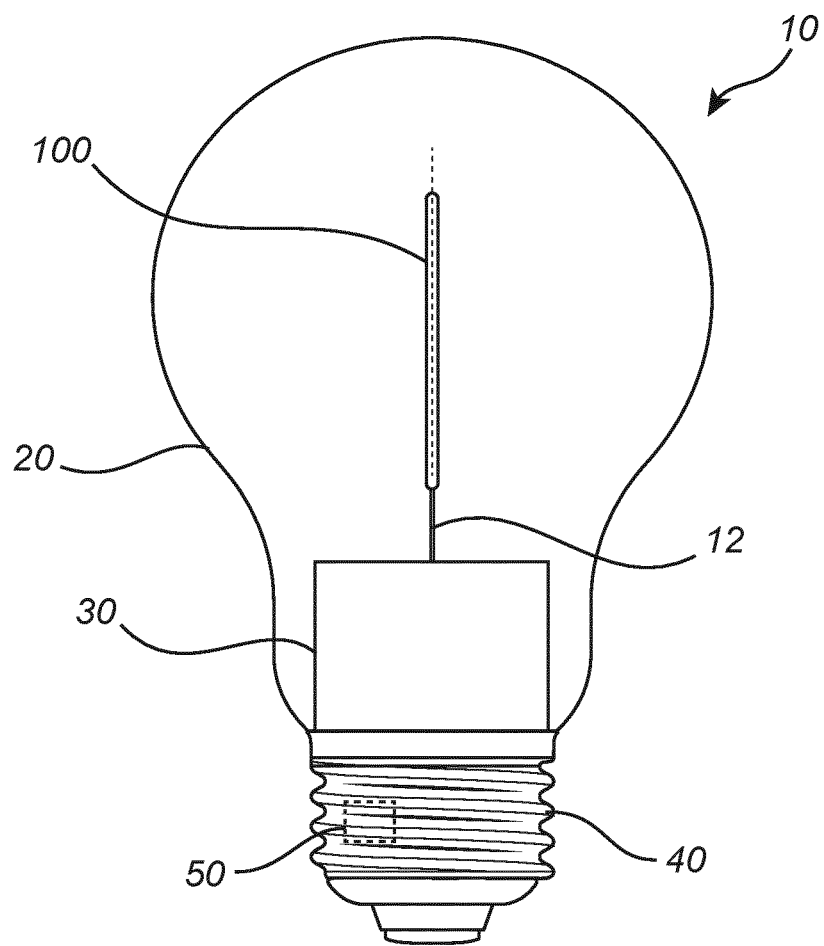
FIG. 1 demonstrates a retrofit light bulb comprising and LED filament.

FIG. 1 demonstrates a retrofit light bulb 10 including an LED filament 100 accommodated within an envelope 20. The LED filament 100 (explained in more detail below) is connected to an electrical (or mechanical) connector 40, through its connecting ends 12 and the connecting wires 30. Similar to the typical incandescent light bulbs, here in FIG. 1, the light bulb 10 comprises an electrical connector 40, here a threaded Edison connector such E26 or E27, in order to connect the lamp 10 to an electric socket (not shown). Note that in this text, retrofit light bulb and lamp are used to refer to the same object, and may be used interchangeably unless noted otherwise.

The LED filament 100, may be configured to emit white light, or light with any other color or spectrum. The LED filament 100, may also be configured to be color tunable, and/or color temperature tunable (in case of white light). The tunability will then be controlled through the controller 50 shown in FIG. 1. The controller 50 may be configured to control the LEDs 110 individually.

Figure 2:
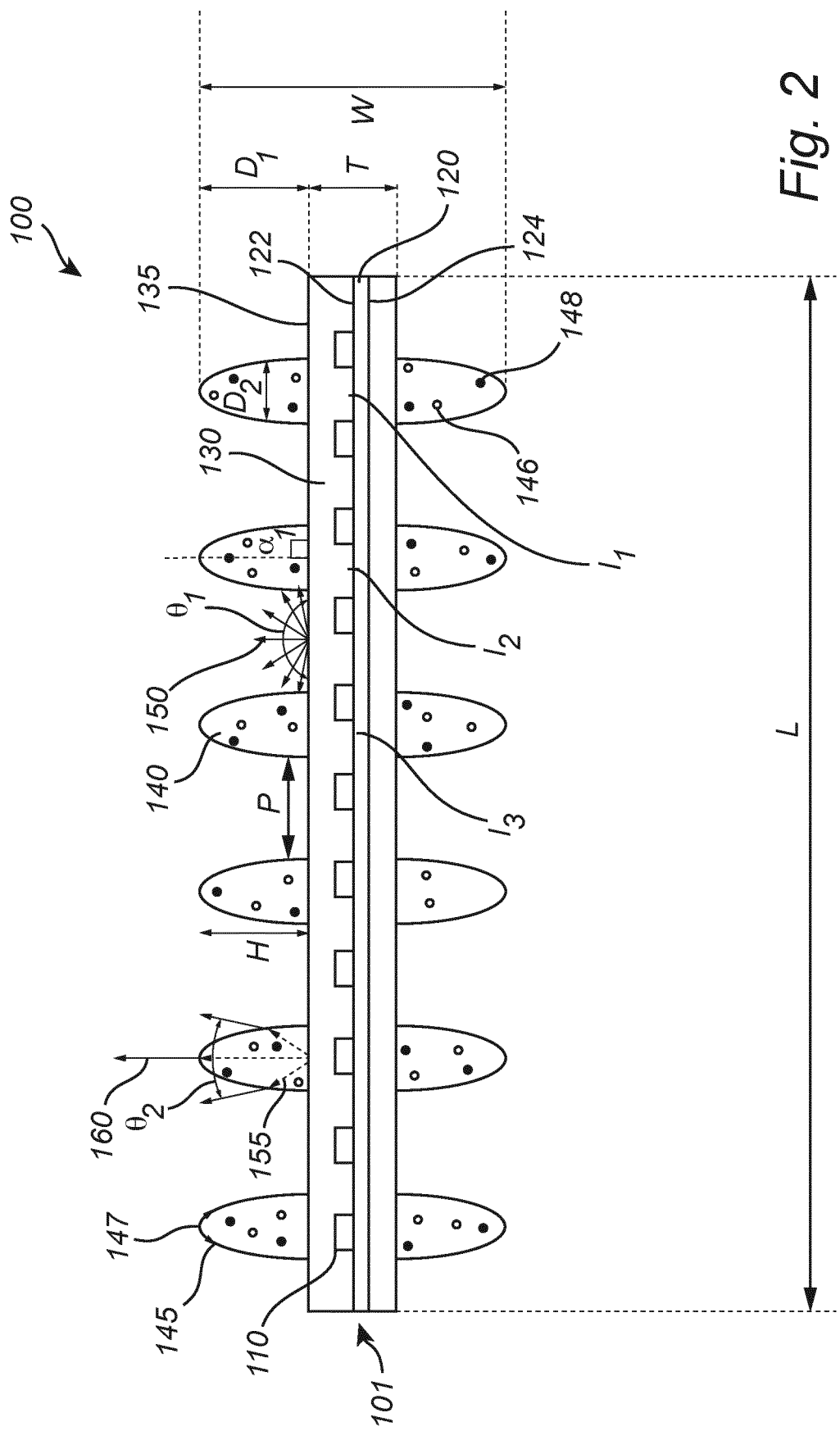
FIG. 2 demonstrates an LED filament with light guiding structures.

In the context of this invention, the LED filaments 100 of the lighting device the lamp 10 shown in FIG. 1 can be described as follows. FIG. 2 demonstrates a vertical cross section of such an LED filament 100. The LEDs 110 are arranged on a first major surface 122 of an elongated carrier 120 for instance a substrate. Please note that in this text the terms "carrier" and "substrate" may be used interchangeably, and unless stated otherwise, are meant to imply the same meaning. Note that, the LEDs 110 may additionally, or alternatively be arranged on a second major surface 124 of the elongated carrier 120. Preferably, the LED filament 100 has a length L and a width W, wherein L>5W. The LED filament 100 may be arranged in a straight configuration similar to FIG. 2, or in a non-straight configuration such as for example a curved configuration, a 2D/3D spiral or a helix.

The linear array in which the LEDs 110 are arranged, may be in the longitudinal direction of the elongated carrier 120. The linear array is preferably a matrix of N×M LEDs 110, wherein N=1 (or 2) and M is at least 10, more preferably at least 15, most preferably at least 20 such as for example at least 30 or 36 LEDs 110.

The carrier 120 may be rigid (made from e.g. a polymer, glass, quartz, metal or sapphire) or flexible (e.g. made of a polymer e.g. a film or foil).

A carrier 120 of rigid material may provide better cooling of the LED filament 100, meaning the heat generated by the LED 110 may be distributed by the rigid substrate 120.

A carrier 120 of flexible material may provide shape freedom for designing the aesthetics of the LED filament 100 due to flexibility.

It should be noted that, the thermal management of thin, flexible material may typically be poorer compared to rigid material. However, on the other hand, having rigid material as the substrate 120, may limit the shape design of the LED filament 100.

The carrier 120 is light transmissive, such as translucent, or preferably light transparent. The transmissive substrate 120 may be composed of for example polymer, glass, quartz, etc.

The advantage of a light transmissive substrate 120 may be that the light emitted from the LED 110 may propagate through the substrate 120, leading to a substantially omni-directional light emission.

According to this invention, the LED filament 100 comprises a core portion 101, which comprises the carrier 120, the LEDs 110, and an encapsulant 130 encapsulating the LEDs and at least a portion of the carrier 120. The core portion 101 has a thickness of T. Note that the encapsulant 130 may be arranged over the first major surface 122 of the carrier. Additionally—as depicted in FIG. 2, or alternatively, the encapsulant 130 may be arranged over the second major surface 124 of the carrier 120. The encapsulant 130 is light transmissive, such as translucent, or preferably light transparent. This may allow the light emitted from the LEDs 110 to traverse the body of the encapsulant 130 and exit from its outer surface 135. FIG. 2 demonstrates a first light 150 exiting the outer surface 135 of the encapsulant 130 with an angular distribution of $\theta_1$.

The LED filament 100 further comprises light guiding structures 140, 240, 340, 440, 540, 640 arranged on discreet longitudinal positions $l_1, l_2, l_3, \ldots$, along the length of the core portion 101, on the outer surface 135 of the encapsulant 130. Note that, unless stated otherwise, the length of the core portion 101 and the filament 100 are considered to be the same, and equal to L. the light guiding structures 140, 240, 340, 440, 540, 640 have an axial dimension D1, which is preferably larger than the other dimensions, such as D2. The axial dimension D1 may be considered as the longest extent of the light guiding structures 140, 240, 340 while D2 may be considered as their width. As these structures are 3D structures, they also have a third dimension D3, which may be considered as their depth. It is notable that, while the axial dimension D1 refers to the longest dimension of the light guiding structures 140, 240, 340, 440, 540, 640, the light guiding structures may also have a height which is defined as the distance from the encapsulant surface (135) to the highest point the light guiding structure extends in a direction normal to the encapsulant surface (135). The height H and the axial dimension D1 would be equal in the embodiments where the light guiding structures 140, 240, 340, 440, 540, 640 are arranged normal to the encapsulant surface (135). However, in embodiments with tilted structures, the height H would always be smaller than the axial dimension D1.

It may be that the width D2 and the depth D3 of the light guiding structures 140, 240, 340, 540, 640 are equal, such that they have a symmetrical cross section normal to the axial direction D1. Alternatively, it may be that the width D2 and the depth D3 of these structures are not equal. The light guiding structures 140, 240, 340, 540, 640 are arranged such that they protrude outwards from the outer surface 135 of the encapsulant 130 and are positioned such that they are separated by a pitch P. In the LED filament 100 of FIG. 2, semi ellipsoid light guiding structures 140 are arranged on the core portion 101, such that their axial dimension D1 extends in a direction normal to the surface 135 of the encapsulant 130 ($\alpha_1=\pi/2$). A portion 155 of the first light 150 is in-coupled into the light guiding structures 140. This portion 155 will undergo total internal reflection within the body of the light guiding structures, such that a second light 160 with a second angular distribution $\theta_2$ is out-coupled from the outer surface 145 of the light guiding structures 140. Note that in order to obtain a substantial sparkling effect, the second angular distribution should preferably be smaller than the first angular distribution ($\theta_1 > \theta_2$). In the embodiment of FIG. 2 an end portion 147 of the light guiding structure 140 is also marked. It may be that light is arranged to out-couple only from this end portion 147, making the second angular distribution $\theta_2$ even narrower.

The number of light guiding structures 140, 240, 340, 540, 640 on an LED filament 100 are preferably at least 5, more preferably at least 10, most preferably at least 20.

In the illustrated embodiment of FIG. 2, the light guiding structures 140 comprise light scattering material, such as light scattering particles 146. These particles 146 are embedded in the matrix of the light guiding structures 140, and aid with mixing light in the body of these structures 140 before out-coupling from the outer surface 145. In case the LEDs 110 are RGB LEDs, the light scattering particles 146 can enhance mixing the RGB colored light, and may lead to white light out-coupling from the light guiding structures 140. In that specific embodiment, it may be that the first light 150 is colored light, or alternatively, white light if the RGB colored light is sufficiently mixed in the body of the encapsulant 130 before exiting its outer surface 135, while the second light 160 is sufficiently mixed white light.

Additionally, or alternatively, the light guiding structures 140 may comprise luminescent material, such as luminescent particles 148 embedded within the matrix of these structures 140. These particles can convert blue light emitted from blue LEDs 110 to white light. According to this embodiment the first light 150 exiting the outer surface 135 of the encapsulant 130 may be blue light, while the second light 160 out-coupled from the light guiding structures may be white light. FIGS. 3a-3c demonstrate different embodiments of the LED filament 100 with different arrangements of semi ellipsoid light guiding structures 140. In FIG. 3a the light guiding structures 140 all have the same general semi ellipsoid form. However, even though the axial dimension D1 of all the light guiding structures are equal in FIG. 3a, their width D2, D2', . . . , differs from one another. FIG. 3b shows an embodiment where the width D2 of the semi ellipsoid light guiding structures 140 are equal, while their axial dimension D1, D1', . . . , differ from one another. The difference between the axial dimensions D1, D1', . . . of the light guiding structures may preferably be at least 20%. In both embodiments of FIGS. 3a and 3b the pitch P between consecutive light guiding structures 140 are equal. FIG. 3c depicts an embodiment in which the axial dimension D1, and the width D2 of the light guiding structures 140 are equal, while the pitch P, P', P", . . . , between each consecutive light guiding structure varies.

Figure 4A:
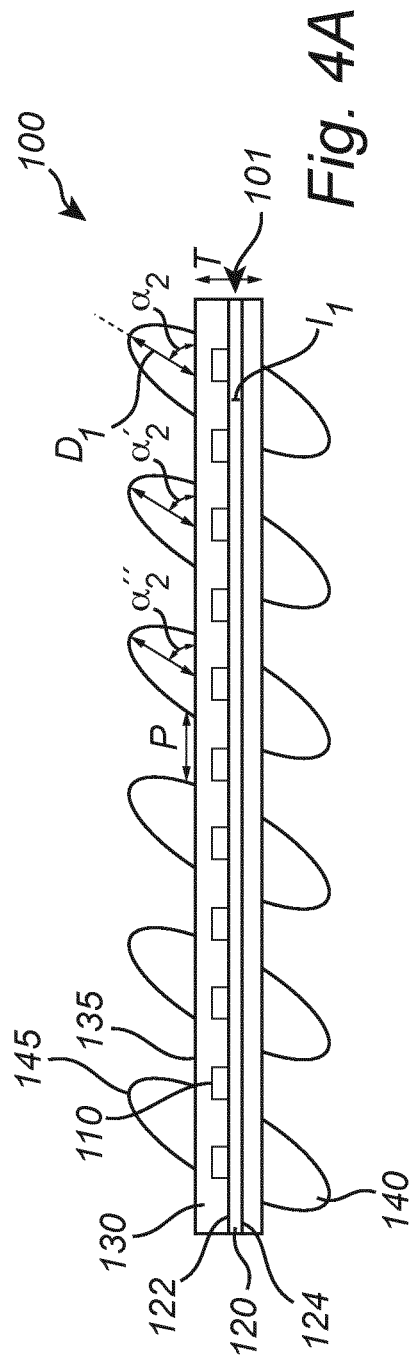
Figure 4B:
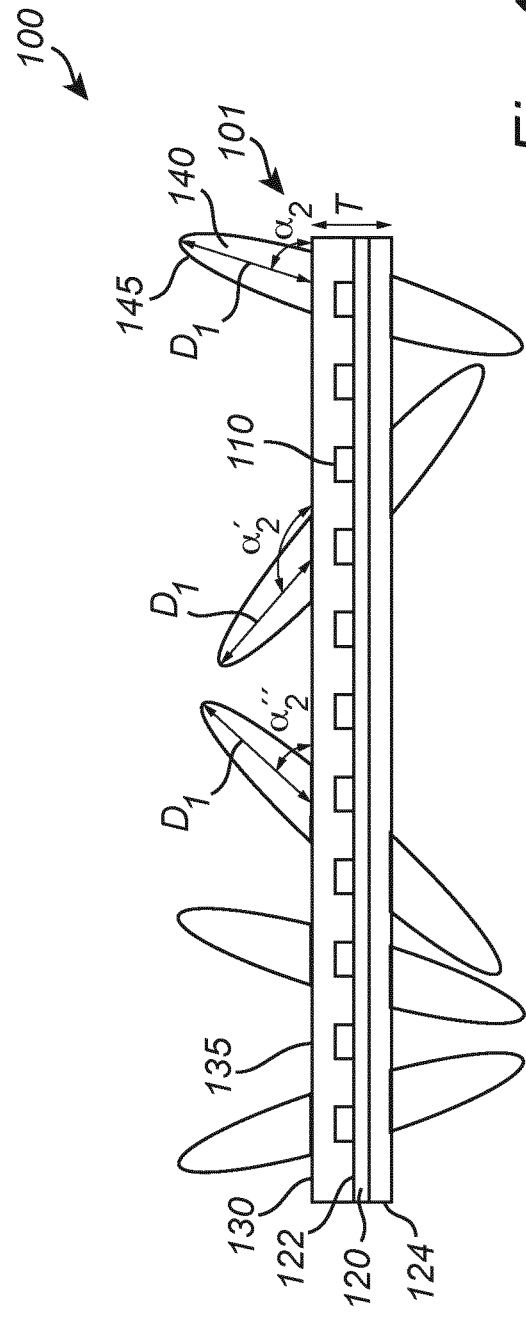

In all the embodiments of the LED filament 100 of FIGS. 2 and 3a-3c the light guiding structures 140 are positioned such that their axial dimension D1, D1', . . . , is extended in a direction normal to the outer surface 135 of the encapsulant 130 ($\alpha_1=\pi/2$). In FIG. 4a semi-ellipsoid light guiding structures 140 with equal forms and sizes are positioned on the outer surface 135 of the encapsulant such that their axial dimension D1 extends in a direction not normal to the outer surface 135 of the encapsulant ($\alpha_2 \neq \pi/2$), meaning that, the light guiding structures 140 of FIG. 4a are tilted with respect to the outer surface 135 of the encapsulant 130. Note that all the light guiding structures 140 in FIG. 4a extend in the same direction: $\alpha_2=\alpha'_2=\alpha''_2=\ldots$ However, in the alternative embodiment of FIG. 4b, the light guiding structures 140 are tilted in different directions with respect to the surface 135 of the encapsulant 130: $\alpha_2 \neq \alpha'_2 \neq \alpha''_2$. The angles may differ from each other preferably at least 20°.

In FIG. 4c another embodiment of the LED filament 100 is illustrated in which the light guiding structures 240 have a cuboid form. The geometric form of the light guiding structures 140, 240, 340, 440, 540, 640 may have an effect on their light guiding properties, hence the sparkling appearance of the LED filament 100. The pitch P between consecutive light guiding structures 240 of FIG. 4c, and their dimensions D1, D2 are equal.

FIG. 5 depicts radial cross sectional views of different embodiments of the LED filament 100 all in which more than one semi ellipsoid light guiding structure 140 is arranged at the same longitudinal position $l_1$ along the length L of the core portion 101. In all embodiments the light guiding structures 140 concentrically surround the core portion 101 of the filament 100. In the views of FIGS. 5a-5f, the axial dimension D1, together with the depth D3 of the light guiding structures are visible. In FIG. 5a-5c, respectively two, three, and four light guiding structures 140 are arranged with radial symmetry around the core portion 101. In other words, in FIG. 5a, $\varphi_1=\varphi_2=\pi$, in FIG. 5b, $\varphi_1=\varphi_2=\varphi_3=2\pi/3$, and in FIG. 5c $\varphi_1=\varphi_2=\varphi_3=\varphi_4=\pi/2$. Alternatively, as shown in the embodiments of FIGS. 5d-5f, the light guiding structures 140 surrounding the core portion 101 at the same longitudinal position $l_1$, do not have radial symmetry in relation to one another. For example, in FIG. 5e, $\varphi_1 \neq \varphi_2 \neq \varphi_3 \neq \varphi_4 \neq \varphi_5$. It may be however, that in some embodiments the light guiding structures 140 are arranged to have a mirrored symmetry with respect to a certain axis.

Figure 6A:
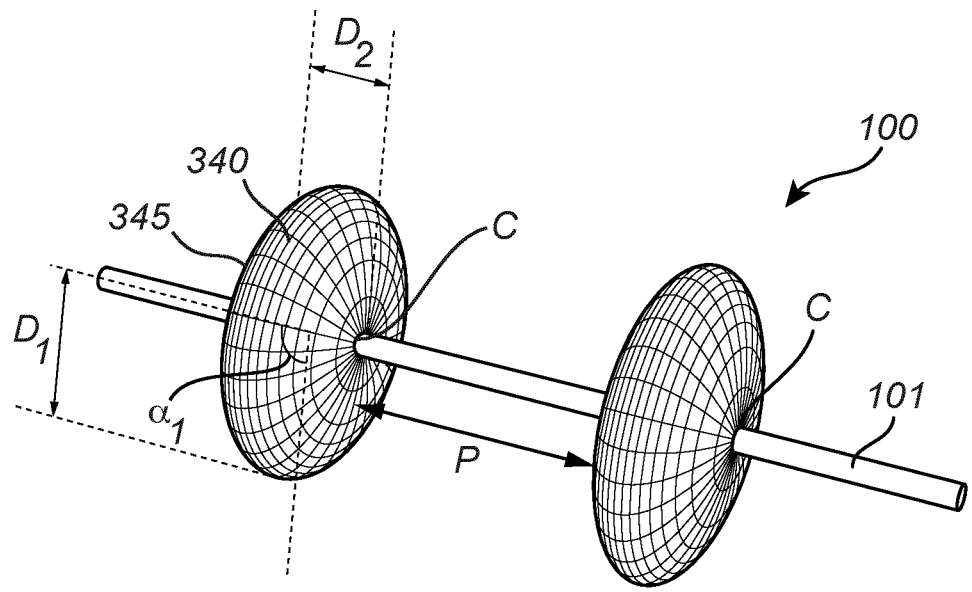
FIGS. 6A-6D demonstrate different views of different embodiments of LED filaments with ellipsoid light guiding structures.
Figure 6B:
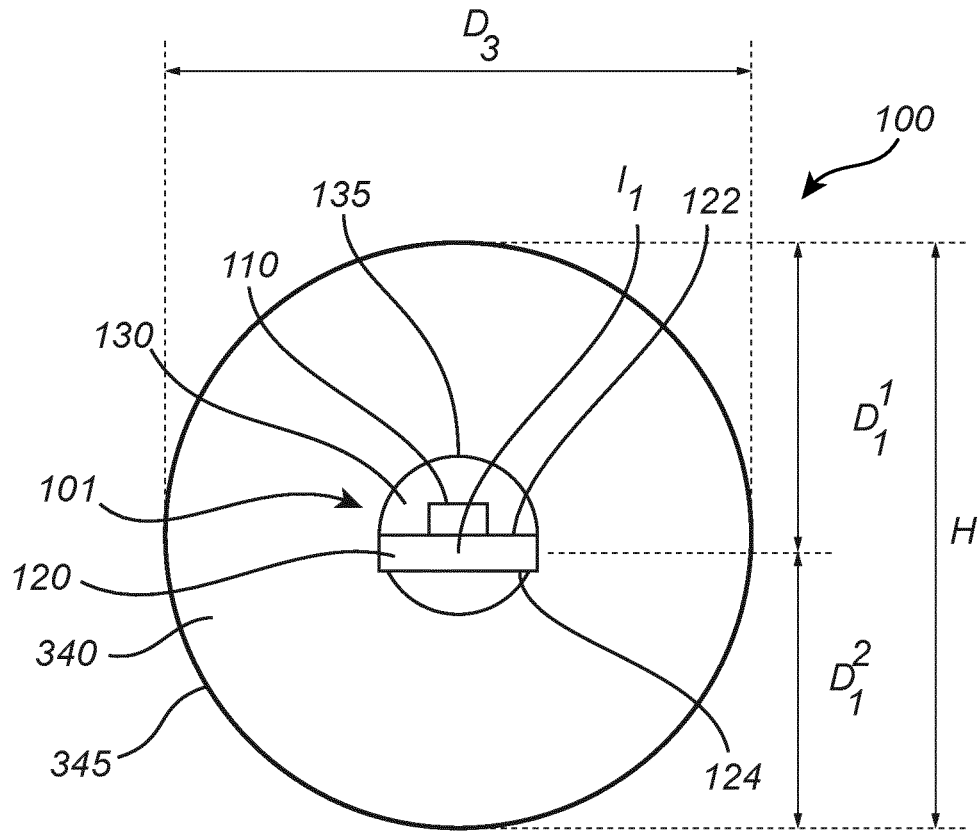
Figure 6C:
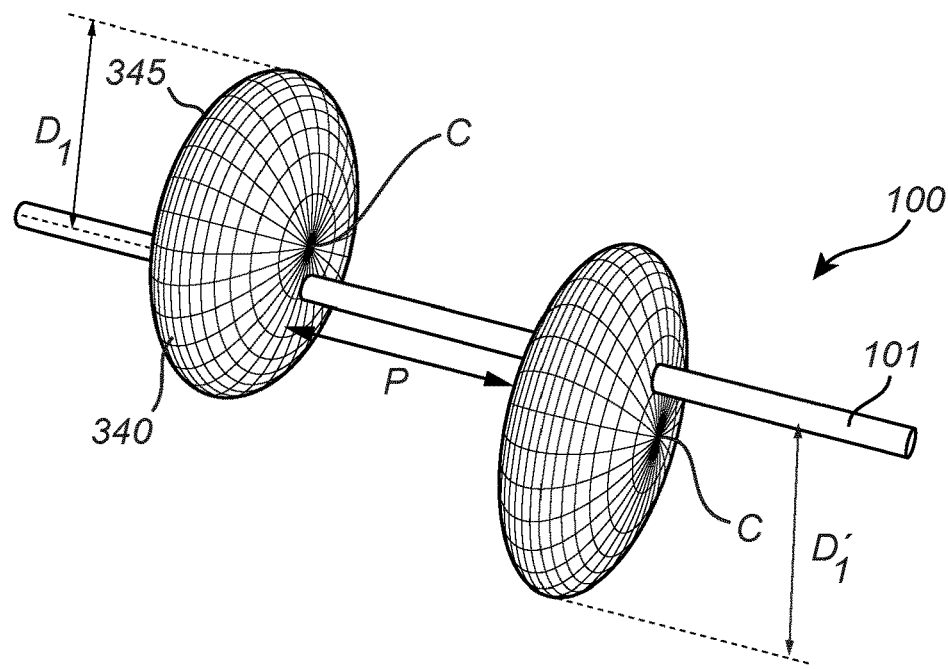
Figure 6D:
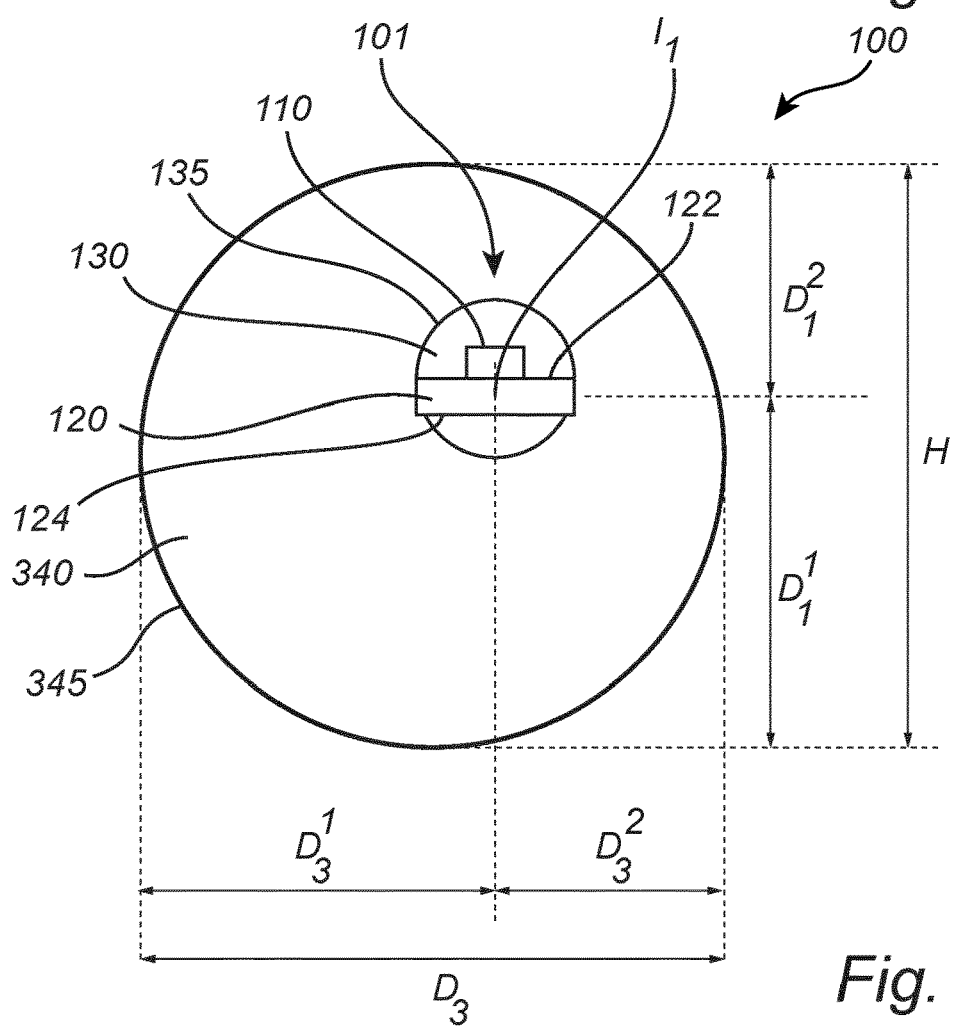

FIG. 6a demonstrates a perspective view of a portion of an LED filament 100 with ellipsoid light guiding structures 340 concentrically surrounding the core portion 101 of the LED filament 100. In this embodiment of the light guiding structures 340 it is preferable that the width D2 is substantially lower than the axial dimension D1, and their depth D3 in order to avoid a thickened appearance of the LED filament 100 and obtain a sparkling effect. Therefore, these light guiding structures 340 may resemble thin disks arranged around the core portion 101 of the filament 100. FIG. 6b depicts a radial cross section of the LED filament 100 through an ellipsoid light guiding structure 340 shown in FIG. 6a. The core portion 101 can be seen surrounded by the light guiding structure 340. In the embodiment of FIG. 6, the light guiding structure has a circular cross section, meaning that the total height H (the total extension of the axial dimension on either side of the core portion 101: $D_1^{\ 1}+D_1^{\ 2}$) and the depth D3 are equal. It may be that H≠D3, which then may lead to a light guiding structure 340 having an elliptical shaped radial cross section. It may also be that contrary to the embodiment shown in FIG. 6b where $D_1^1=D_1^2$, the extension of the axial dimension on either side of the core portion 101 are not equal: $D_1^1 \neq D_1^2$. This embodiment is illustrated in FIG. 6c, where the core portion 101 is no longer arranged traversing the center C of the ellipsoid light guiding structures 340. Additionally—as shown in the embodiment of FIG. 6d, or alternatively, it may be that the core portion 101 does not traverse the depth D3 of the light guiding structures 340 symmetrically ($D_3^1 \neq D_3^2$). Instead, the light guiding structure 340 will be thicker on one side relative to the core portion 101 of the filament 100 than another.

Additionally, or alternatively, it may be that the ellipsoid light guiding structures 340 are not normal to the surface 135 of the encapsulant 130, but are positioned in a tapered manner.

Figure 7:
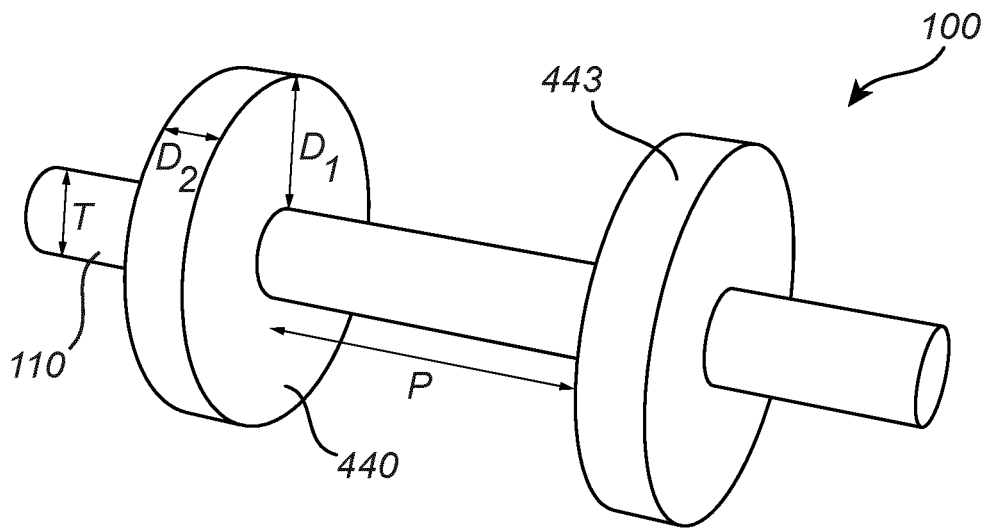
FIG. 7 demonstrates an embodiment of an LED filament with light guiding structures.

While the form of the ellipsoid light guiding structures 340 may be achieved by a full rotation of the semi ellipsoid structures 140 about the direction of extension of their width D2, if a cuboid structure 240 undergoes the same full rotation, a light guiding structure with the form of an annular disk can be achieved. FIG. 7 demonstrates the filament 100 with this embodiment of the light guiding structures 440. As observed, the core portion 101 of the filament traverses through the annular disk light guiding structures 440. The difference between these structures and the thin disks 340 mentioned in the description of FIG. 6 is that, the side facets 443 of the annular disk 440 are flat, and do not have a curvature as do the ellipsoid disks 340. This may affect the light guiding properties, hence the sparkling appearance of the filament 100.

Figure 8:
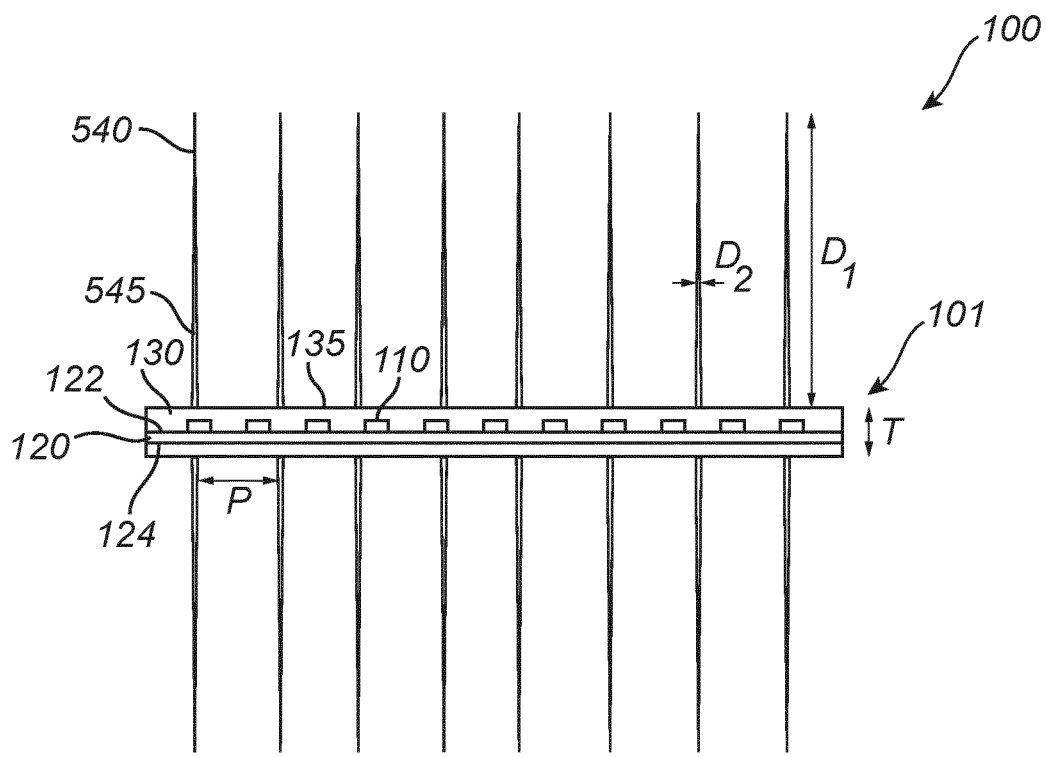
FIG. 8 demonstrates an embodiment of an LED filament with light guiding structures.

FIG. 8 demonstrates another embodiment of the LED filament 100 with light guiding structures 540 that have a drastically higher aspect ratio compared to all previous embodiments discussed above. The aspect ratio ($D_1/D_2$) of the light guiding structures 540 may preferably be around 5. The light guiding structures 540 may then be referred to as needle formed light guiding structures. The light guiding structures 540 may have an even higher aspect ratio ($D_1/D_2$) of around 10. These light guiding structures 540 may then be referred to as fiber formed light guiding structures.

Figure 9A:
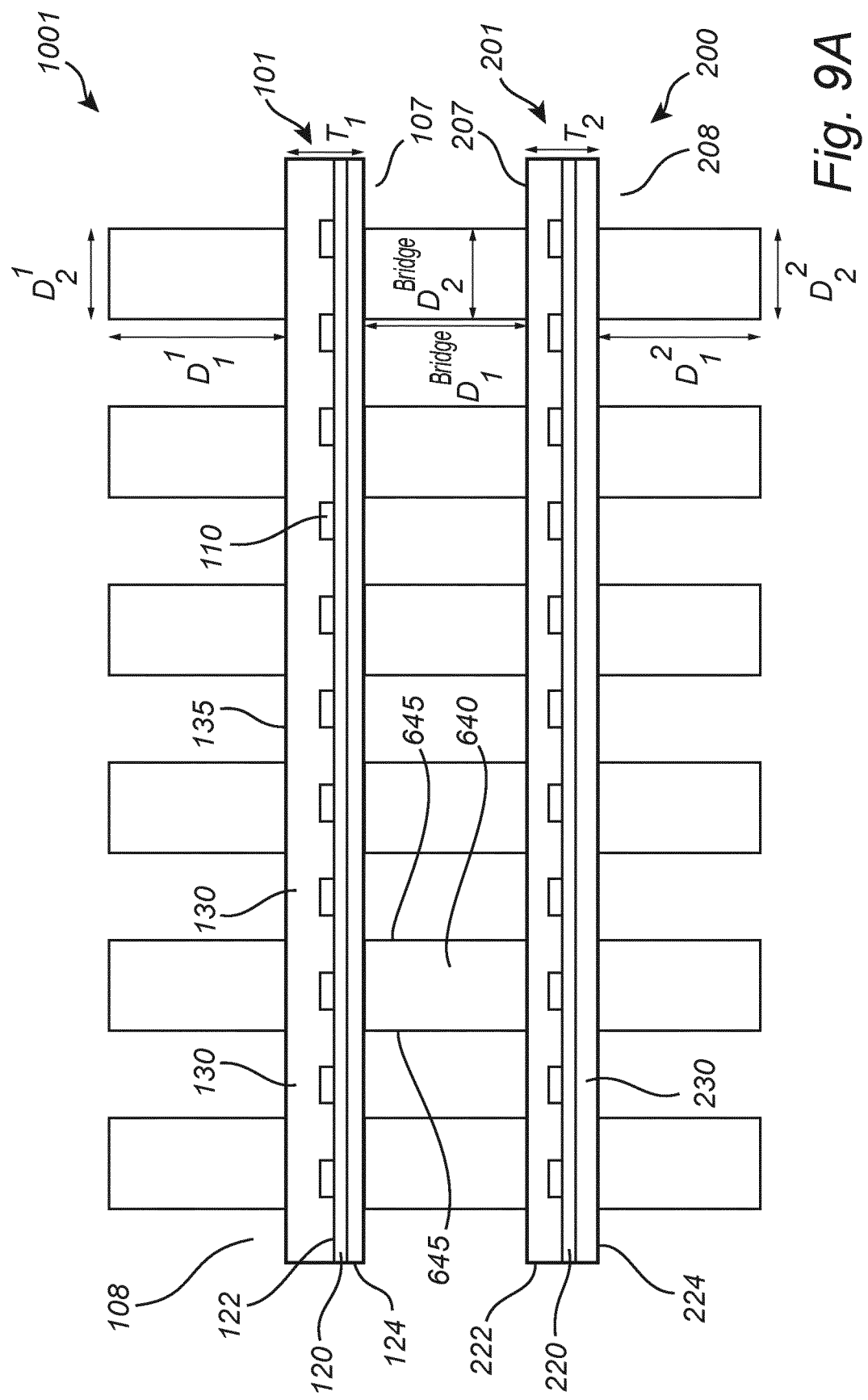
FIGS. 9A-9B demonstrate different views of an embodiment of an LED filament with light guiding structures.
Figure 9B:
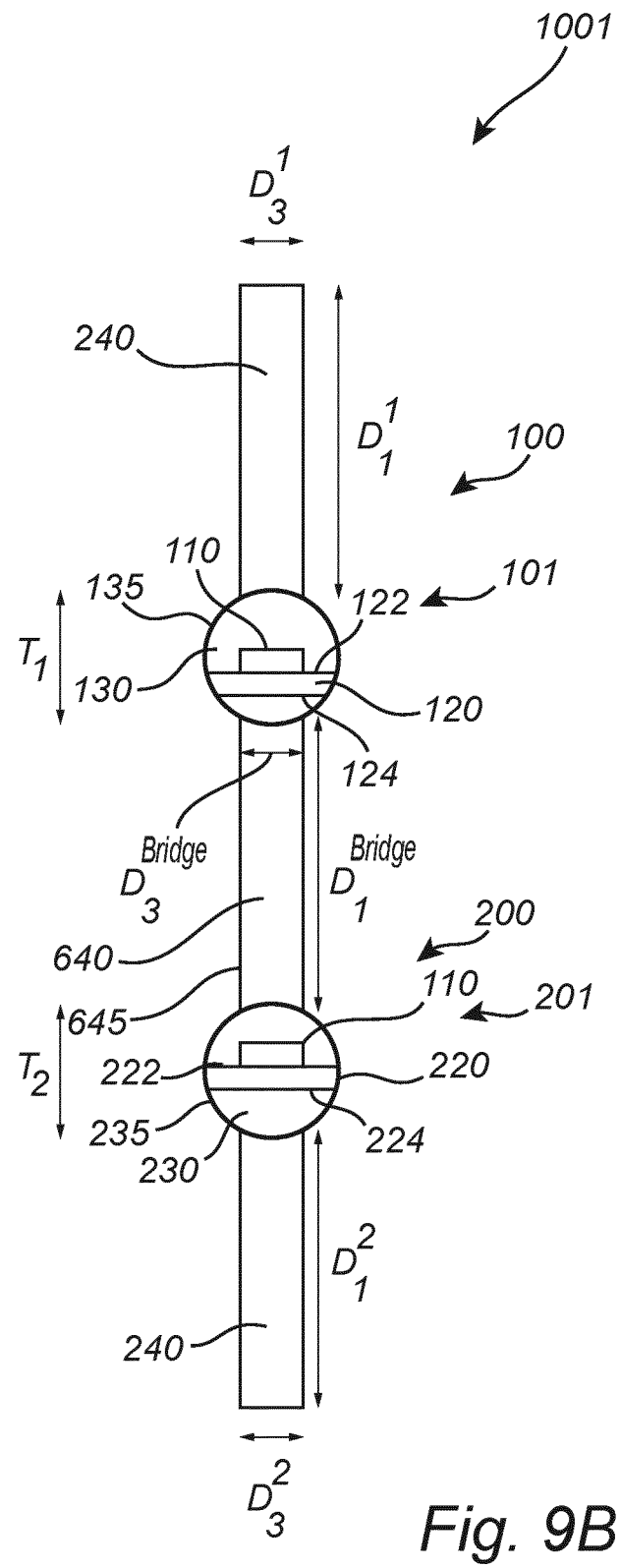

FIGS. 9a and 9b demonstrate an embodiment of a bridged filament 1001 from a vertical cross-sectional view, and a radial cross-sectional view, respectively. In the depicted embodiment of the bridged filament 1001, two LED filaments 100, 200 are bridged together with a bridging light guiding structure 640. both filaments 100, 200 are depicted to have light guiding structures 240 on either side 108, 208 to their bridged sides 107, 207. The thickness $T_1$, $T_2$ of the core portion 101, 201 of the LED filaments 100, 200 may be equal, or alternatively different. In the embodiments of FIGS. 9a and 9b, all the light guiding structures 240, 640, have a cuboid form. Alternatively, the light guiding structures 240, 640 may have different forms. The axial dimension $D_1^1$, $D_1^2$, $D_1^{Bridge}$ of all light guiding structures 240, 640 may all be equal, or alternatively not equal. Similarly, the width $D_2^1$, $D_2^2$, $D_2^{Bridge}$, and the depth $D_3^1$, $D_3^2$, $D_3^{Bridge}$, of the light guiding structures 240, 640 may be equal, or alternatively differ from one another. In some embodiments more than one LED filament 100, 200 may be bridged together. The LED filaments 100, 200 may be bridged together in a parallel manner similar to the embodiment of FIG. 9, or they may be bridged such that they coalesce, and/or form intricate structures of the bridged filament 1001.

The in-coupled light from each of the filaments 100, 200 into the bridging light guiding structures 640, may merge and be coupled out from the side surfaces 645 of the bridging light guiding structure 640. Additionally, or alternatively, in-coupled light from each of the LED filaments 100, and 200 may traverse the encapsulant 230, 130, and/or the transmissive carrier 220, 120 of the other LED filament 200, 100, and be coupled out either from the core portion 201, 101 of the filaments 200, 100. Additionally, or alternatively, the light may traverse and undergo a secondary in-coupling into the light guiding structures 240 sitting on the opposite sides 208, 108 of the filaments 200, 100 to the bridged sides 207, 107. Light will then be out coupled from these light guiding structures 240.

The person skilled in the art realizes that the present invention by no means is limited to the preferred embodiments described above. On the contrary, many modifications and variations are possible within the scope of the appended claims. For example, it may be that more than on core portion of LED filaments are surrounded by the same light guiding structure. Additionally, it may be that each of the core portions of LED filaments have a certain colored LED, therefore emit different colors compared to one another.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting diode, LED, filament comprising:
   a core portion having
      an elongated carrier, comprising a first major surface and a second major surface opposite to said first major surface,
      a plurality of LEDs arranged on at least one of said first and second major surfaces of said elongated carrier, and configured to emit LED light, and
   a light transmissive encapsulant, encapsulating said plurality of LEDs, and at least partially encapsulating said elongated carrier, and configured to transmit a first light with a first angular distribution; and
   a plurality of light transmissive light guiding structures arranged on discreet portions of an outer surface of said encapsulant, along a length, L, of said core portion, and arranged to in-couple a portion of said first light, and out-couple a second light, with a second angular distribution, such that said second angular distribution is narrower than said first angular distribution; and
   wherein said light guiding structures have an axial dimension, D1, a width, D2, and a depth, D3, and said axial dimension extends outwards from said outer surface of said encapsulant, and is larger than the width D2, and the depth D3.

2. The LED filament according to claim 1, wherein said carrier is light transmissive.

3. The LED filament according to claim 1, wherein said axial dimension D1 of the light guiding structures is at least two times.

4. The LED filament according to claim 1, wherein said light guiding structures are fiber-like structures such that the axial dimension D1 is at least 10 times larger than said width D2 of the light guiding structures.

5. The LED filament according to claim 1, wherein said axial dimension D1 extends in a direction normal to the outer surface of said encapsulant.

6. The LED filament according to claim 1 wherein said axial dimension D1 of the light guiding structures is at least two times larger than a thickness T of the core portion of the filament.

7. The LED filament according to claim 1, wherein the light guiding structures are arranged on said encapsulant such that a pitch P between each consecutive light guiding structure is equal to or, larger than said core portion thickness T.

8. The LED filament according to claim 7, wherein the pitch P between the consecutive light guiding structures are equal.

9. The LED filament according to claim 1, wherein at least a subset of said light guiding structures have an equal shape and/or size.

10. The LED filament according to claim 1, the light guiding structures have an ellipsoid form, arranged concentrically around said core portion of the filament, and such that said axial dimension of the light guiding structures is the largest axis of said ellipsoid.

11. The LED filament according to claim 1, wherein two or more light guiding structures are arranged on a same longitudinal position along the length of said core portion of the filament, concentrically surrounding the core portion.

12. The LED filament according to claim 1, wherein said light guiding structures are light transparent such that a portion of the in-coupled light undergoes a total internal reflection within said light guiding structures at least twice before being out-coupled from an end portion of the light guiding structure.

13. The LED filament according to claim 1, wherein light is arranged to out-couple only from said end portion of said light guiding structures.

14. A retrofit light bulb, comprising at least one LED filament according to claim 1, a transmissive envelope, at least partially surrounding said LED filament(s), and a connector for electrically and mechanically connecting said light bulb to a socket.

* * * * *